US010820453B2

(12) United States Patent
Zhu et al.

(10) Patent No.: US 10,820,453 B2
(45) Date of Patent: Oct. 27, 2020

(54) POWER CABINET, GRID-CONNECTED PHOTOVOLTAIC SYSTEM AND CONTAINER

(71) Applicant: SUNGROW POWER SUPPLY CO., LTD., Hefei, Anhui (CN)

(72) Inventors: Qiyao Zhu, Anhui (CN); Jun Tan, Anhui (CN); Rubin Wan, Anhui (CN); Hao Zheng, Anhui (CN)

(73) Assignee: SUNGROW POWER SUPPLY CO., LTD., Anhui (CN)

( * ) Notice: Subject to any disclaimer, the term of this patent is extended or adjusted under 35 U.S.C. 154(b) by 0 days.

(21) Appl. No.: 16/705,551

(22) Filed: Dec. 6, 2019

(65) Prior Publication Data
US 2020/0187391 A1 Jun. 11, 2020

(30) Foreign Application Priority Data
Dec. 10, 2018 (CN) .......................... 2018 1 1503861

(51) Int. Cl.
*H05K 7/20* (2006.01)
*H02S 99/00* (2014.01)

(52) U.S. Cl.
CPC ......... *H05K 7/20909* (2013.01); *H05K 7/202* (2013.01); *H02S 99/00* (2013.01)

(58) Field of Classification Search
None
See application file for complete search history.

(56) References Cited

U.S. PATENT DOCUMENTS 8,233,278 B2    7/2012  Hoffman et al.
8,289,709 B2 *  10/2012 Feltner ............... H05K 7/20909
                                                        361/695

(Continued)

FOREIGN PATENT DOCUMENTS

CN      206962688 U    2/2018
CN      108092490 A    5/2018
(Continued)

OTHER PUBLICATIONS

European Search Report regarding Application No. 19212102.8 dated Apr. 20, 2020.

*Primary Examiner* — Courtney L Smith
(74) *Attorney, Agent, or Firm* — Harness, Dickey & Pierce, P.L.C.

(57) ABSTRACT

A power cabinet, a grid-connected photovoltaic system and a container are provided according to the present application. In the power cabinet, three types of devices, namely, a heat dissipation element, a magnetic element, and a high-protection-level element are arranged in three mutually independent cavities, respectively; corresponding heat dissipation devices are further arranged in the three cavities respectively, and each of the heat dissipation devices meets the heat dissipation requirements of the devices in the corresponding cavity. With this arrangement, the three types of devices have their own heat dissipation solutions respectively and do not affect one another. Even if they are operated for a long time in a dusty environment, the magnetic element will not be affected by dust since the heat dissipation requirements of the three devices are satisfied in the three cavities respectively, and the reliability is improved compared with the conventional technology.

20 Claims, 2 Drawing Sheets

(56) References Cited

U.S. PATENT DOCUMENTS

| | | | | |
|---|---|---|---|---|
| 9,077,209 B2* | 7/2015 | Kanno | .................... | H02J 50/20 |
| 9,084,376 B2* | 7/2015 | Weiss | .................... | H05K 13/00 |
| 9,820,413 B2* | 11/2017 | Ikezawa | ................ | H05K 7/209 |
| 9,986,665 B2* | 5/2018 | Kosaka | ................ | H02M 7/537 |
| 10,236,665 B2* | 3/2019 | Groner | .................... | H02B 1/48 |
| 10,454,254 B2* | 10/2019 | Kin | .................... | H05K 7/1432 |
| 10,498,195 B2* | 12/2019 | Mergener | ................ | H02K 11/33 |
| 10,645,849 B2* | 5/2020 | Valle | .................... | H05K 7/2049 |
| 2004/0140554 A1* | 7/2004 | Kataria | ............... | H01L 23/4006 |
| | | | | 257/706 |
| 2006/0126309 A1* | 6/2006 | Bolle | ................. | H05K 9/0033 |
| | | | | 361/719 |
| 2014/0252587 A1* | 9/2014 | Kodama | ............... | H01L 23/467 |
| | | | | 257/712 |

FOREIGN PATENT DOCUMENTS

| | | |
|---|---|---|
| CN | 207897287 U | 9/2018 |
| EP | 2879475 A1 | 6/2015 |

* cited by examiner

POWER CABINET, GRID-CONNECTED PHOTOVOLTAIC SYSTEM AND CONTAINER

CROSS REFERENCE TO RELATED APPLICATIONS

This application claims the priority to Chinese Patent Application No. 201811503861.6 titled "POWER CABINET, GRID-CONNECTED PHOTOVOLTAIC SYSTEM AND CONTAINER", filed with the China National Intellectual Property Administration on Dec. 10, 2018, which is incorporated herein by reference in its entirety.

FIELD

The present application relates to the technical field of inverters, and in particular to a power cabinet, a grid-connected photovoltaic system and a container.

BACKGROUND

The grid-connected photovoltaic inverter functions as an interface device between the solar energy generation system and the power grid, and the reliability of the inverter determines whether the photovoltaic power generation system can operate safely. In order to ensure the reliability of the inverter, the design and implementation of the circuit are required to meet the requirements, in addition, since the heat dissipation performance of the inverter power cabinet and the good protection performance in various severe weather conditions have important influences on the working stability, product reliability, and service life of the power devices of the entire inverter system, the power cabinet is also required to have good heat dissipation performance and protection performance.

In the design of structural configuration of the cabinet body of the inverter power cabinet, the cavity configuration and heat dissipation air ducts directly affect the protection performance and heat dissipation performance of the product. In the inverter power cabinet of the conventional technology, two separate cavities are generally provided according to the required protection level of the elements, one cavity with a low protection level, such as a direct ventilation cavity, which is provided with a cooling body and elements required to be cooled such as magnetic elements, and the heat generated during the operation of the device is discharged from the cavity by forced air cooling of the fan; since the heat dissipation efficiency of the direct ventilation is high, for elements which generate large amount of heat, the heat generated during the operation of the device can be rapidly discharged from the cavity.

However, in the conventional technical solution, since the direct ventilation is performed by the fan for heat dissipation, if the inverter is operated for a long time in the dusty environment, a large amount of dirt or conductive dust will enter the cavity, and then enter the surface or interior of the magnetic elements in the cavity, thereby decreasing product reliability.

SUMMARY

A power cabinet, a grid-connected photovoltaic system and a container are provided according to the present application, to address the low reliability problem in the conventional technology due to the influence of the dusty environment on the magnetic elements.

In order to achieve the above object, the technical solutions according to the present application are as follows.

A power cabinet is provided according to an aspect of the present application, including three mutually independent cavities, namely, a first cavity, a second cavity, and a third cavity; wherein a heat dissipation element and a first heat dissipation device are arranged in the first cavity, and the first heat dissipation device is configured to meet all heat dissipation requirements of the heat dissipation element;

a magnetic element and a second heat dissipation device are arranged in the second cavity, and the second heat dissipation device is configured to meet all heat dissipation requirements of the magnetic element; and a high-protection-level element and a third heat dissipation device are arranged in the third cavity, and the third heat dissipation device is configured to meet heat dissipation requirements of the high-protection-level element.

Preferably, the third cavity is arranged at one side of the power cabinet; the first cavity and the second cavity are arranged at another side of the power cabinet; and the first cavity and the second cavity are arranged in an up-down direction, and both the first cavity and the second cavity are closely connected to the third cavity.

Preferably, the first heat dissipation device includes a first air inlet, a first air outlet, and a first fan; both the first air inlet and the first air outlet are arranged at a surface of the first cavity; and the first fan is arranged inside the first cavity.

Preferably, the first air inlet is arranged at a lower portion of a side surface of the first cavity; the first air outlet is arranged at an upper portion of the side surface of the first cavity or at a top portion of the first cavity; and the first fan is arranged below the heat dissipation element.

Preferably, the first air inlet is arranged at an upper portion of a side surface of the first cavity or at a top portion of the first cavity; the first air outlet is arranged at a lower portion of the side surface of the first cavity; and the first fan is arranged above the heat dissipation element.

Preferably, all of the first air inlet, the first air outlet and the first fan meet requirements of protection class IP65.

Preferably, the second heat dissipation device includes a second air inlet and a second fan; the second air inlet is arranged at a surface of the second cavity; and the second fan is arranged inside the second cavity.

Preferably, the second air inlet is arranged at a lower portion of a side surface of the second cavity or at a bottom portion of the second cavity; and the second fan is arranged at an opening at an upper portion of the side surface of the second cavity.

Preferably, the second air inlet is arranged at an upper portion of a side surface of the second cavity; and the second fan is arranged at a lower portion of the side surface of the second cavity or at an opening at a bottom portion of the second cavity.

Preferably, both the second air inlet and the second fan meet requirements of protection class IP65.

Preferably, the magnetic element is allowed to meet requirements of protection class IP65 through a potting process.

Preferably, the second heat dissipation device includes a first heat exchanger connected to the second cavity.

Preferably, the third heat dissipation device includes a second heat exchanger connected to the third cavity.

Preferably, an internal circulation fan and at least one partition plate are further arranged in the third cavity, so as to form a circulation air duct inside the third cavity.

Preferably, the high-protection-level element includes a power switch tube, a capacitor, and a circuit board.

Preferably, the magnetic element includes an electric reactor, a choking coil, and a transformer.

A grid-connected photovoltaic system is provided according to another aspect of the present application, including the inverter power cabinet according to any one of the above solutions.

A container is provided according to yet another aspect of the present application, including the power cabinet according to any one of the above solutions.

According to the power cabinet of the present application, three types of devices, namely, a heat dissipation element, a magnetic element, and a high-protection-level element are arranged in three mutually independent cavities, respectively; corresponding heat dissipation devices are further arranged in the three cavities respectively, and each of the heat dissipation devices meets the heat dissipation requirements of the device in the corresponding cavity. With this arrangement, the three types of devices have their own heat dissipation solutions respectively and do not affect one another. Even if they are operated for a long time in a dusty environment, the magnetic element will not be affected by dust since the heat dissipation requirements of the three devices are satisfied in the three cavities respectively, and the reliability is improved compared with the conventional technology.

BRIEF DESCRIPTION OF DRAWINGS

For more clearly illustrating embodiments of the present application or the technical solutions in the conventional technology, drawings referred to describe the embodiments or the conventional technology will be briefly described hereinafter. Apparently, the drawings in the following description are only some examples of the present application, and for those skilled in the art, other drawings may be obtained based on these drawings without any creative efforts.

DETAILED DESCRIPTION

The technical solution according to the embodiments of the present application will be described clearly and completely as follows in conjunction with the accompany drawings in the embodiments of the present application. It is obvious that the described embodiments are only a part of the embodiments according to the present application, rather than all of the embodiments. All the other embodiments obtained by those skilled in the art based on the embodiments in the present application without any creative work belong to the scope of protection of the present application.

In order to solve the problem in the conventional art that a dusty environment may affect magnetic elements and thus leads to low reliability, a power cabinet is provided according to the present application, which may be any power conversion device and a cabinet body thereof, for example, an inverter power cabinet.

Figure 1:
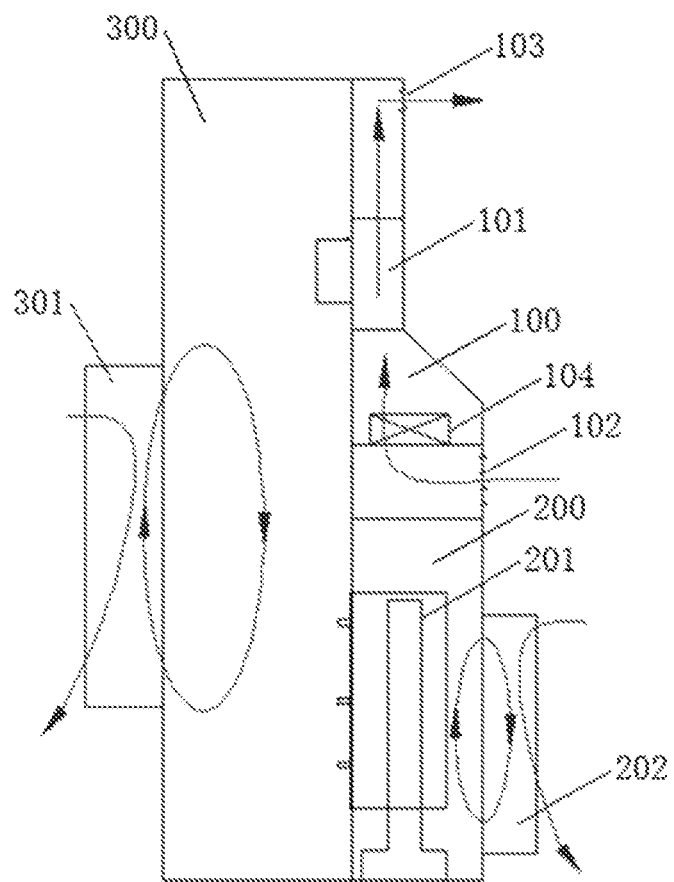
FIG. 1 is a schematic view showing the structure of a power cabinet according to an embodiment of the present application.
Figure 2:
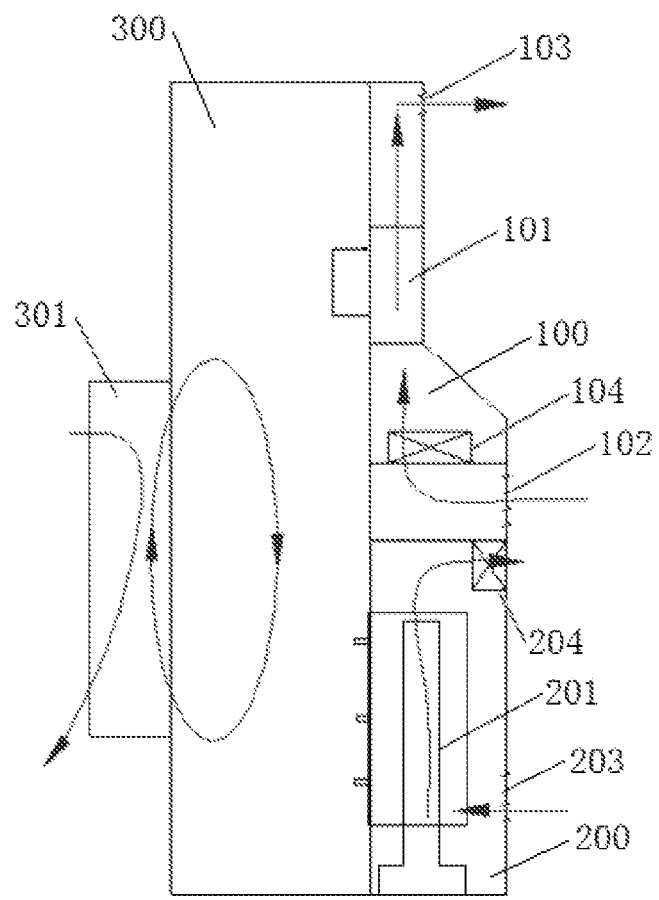
FIG. 2 is a schematic view showing the structure of another power cabinet according to another embodiment of the present application.

Specifically, the power cabinet includes three mutually independent cavities, namely, a first cavity 100, a second cavity 200, and a third cavity 300, as shown in FIGS. 1 and 2. A heat dissipation element 101 and a first heat dissipation device are arranged in the first cavity 100. The first heat dissipation device meets heat dissipation requirements of the heat dissipation element 101. Taking an inverter power cabinet as an example, the heat dissipation element 101 mainly refers to a cooling body of a power switch tube (for example, an Insulated Gate Bipolar Translator which is abbreviated as IGBT). In practical implementation, heat dissipation can be achieved through direct heat exchange between the first heat dissipation device and ambient air via a fan and corresponding air inlet and outlet. That is, the first heat dissipation device may include a first air inlet 102, a first air outlet 103 and a first fan 104; wherein the first air inlet 102 and the first air outlet 103 are arranged at a surface of the first cavity 100, and the first fan 104 is arranged inside the first cavity 100.

As shown in FIGS. 1 and 2, the first air inlet 102 is arranged at a lower portion of a side surface of the first cavity 100; the first air outlet 103 is arranged at an upper portion of the side surface of the first cavity 100; and the first fan 104 is arranged below the heat dissipation element 101.

The side surface of the first cavity 100 refers to any one of side surfaces of the first cavity 100 except an upper surface and a lower surface, preferably a relatively wide surface, as shown in FIGS. 1 and 2. In this way, the air inlet and outlet are relatively large, which is not only beneficial for heat exchange of the air inside the first cavity 100 through the air inlet and outlet, but also convenient for installation.

In practical implementation, ventilation of the first cavity 100 may be performed in a manner that air enters from the lower portion of the side surface and exits from the upper portion of the side surface, as shown by arrow lines inside and outside the first cavity 100 in FIGS. 1 and 2. The ventilation of the first cavity 100 may also be performed in a manner that the air enters from the side surface and exits from a top portion, that is, the first air inlet 102 is arranged at the lower portion of the side surface of the first cavity 100, and the first air outlet 103 is arranged at the top (the upper surface) of the first cavity 100. Or, the ventilation of the first cavity 100 may also be performed in a manner that the air enters from the upper portion of the side surface or the top portion and exits from the lower portion of the side surface, which is opposite to a ventilation direction shown in FIGS. 1 and 2, that is, the first air inlet 102 is arranged at the upper portion of the side surface (or the top portion) of the first cavity 100, and the first air outlet 103 is arranged at the lower portion the first cavity 100, and the first fan 104 is arranged above the heat dissipation element 101. In a word, the solution employing the fan is not only limited to the specific arrangement of the fan and air inlet and outlet shown in FIGS. 1 and 2, and it falls within the scope of protection of the present application as long as the heat dissipation requirements of the heat dissipation element 101 can be satisfied. Moreover, a louver may be arranged at the air inlet and the air outlet, to reduce the entry of the dust. In addition, other heat dissipation devices such as heat exchangers may be chosen, depending on the actual working environment, for the heat exchange of the heat dissipation element 101.

A magnetic element 201 and a second heat dissipation device are arranged in the second cavity 200. The second heat dissipation device meets the heat dissipation requirements of the magnetic element 201. The magnetic element 201 mainly refers to an electric reactor, a choking coil, and a transformer, such as the electric reactor in an inverter circuit.

In order to avoid the problem in the conventional art that the magnetic element may be affected by dust since the heat dissipation element and the magnetic element share the same heat dissipation device and heat dissipation environment, in this embodiment, the magnetic element 201 is separately provided with a second heat dissipation device that meets its heat dissipation requirements, and the magnetic element 201 and the second heat dissipation device are arranged in the independent second cavity 200.

To avoid the influence of dust, in practical implementation, the second heat dissipation device is preferably a heat exchanger connected to the second cavity 200, that is, a first heat exchanger 202 shown in FIG. 1. Heat inside the cavity can be dissipated to the outside through heat exchange via the heat exchanger, which can prevent the air inside the cavity from being in contact with the ambient air, thereby preventing the outside polluted air from entering the inside of the cavity, and thus the cavity can be dust-tight.

In practical implementation, the first heat exchanger 202 may be arranged on a side surface of the second cavity 200. Taking a case that the second cavity 200 is a rectangular block as an example, the side surface of the second cavity 200 refers to any one of four side surfaces except an upper surface and a lower surface, preferably a relatively wide side surface, as shown in FIG. 1. In this way, not only the heat exchange between the first heat exchanger 202 and the air inside the second cavity 200 can be performed through a relatively large area (as shown by arrow lines inside and outside the second cavity 200 in FIG. 1), but also the installation is more convenient. In practical implementation, the first heat exchanger 202 may also be arranged on other surfaces, as long as the heat dissipation requirements of the magnetic element 201 can be satisfied, and the solutions of the above arrangement fall within the scope of protection of the present application.

In addition, the influence of dust can also be avoided by increasing a protection class of the magnetic element 201 itself. For example, the protection class of the magnetic element 201 shown in FIG. 2 can be increased by a potting process or the like. For example, in a case that the magnetic element 201 is required to meet the requirements of the protection class IP65, an iron core thereof is sealed according to IP65 standard, and a coil is sealed at ends according to IP65 standard. In this case, the second heat dissipation device may be a fan and corresponding air inlet and outlet, to allow the magnetic element 201 to exchange heat directly with the ambient air through the fan and the air inlet and outlet, thereby discharging the heat from the cavity. Compared with employing a heat exchanger, the above solution by employing the fan and the air inlet and outlet can improve heat dissipation efficiency, thus can obtain better heat exchange effect.

The second heat dissipation device specifically includes a second air inlet 203 and a second fan 204. The second air inlet 203 is arranged at a surface of the second cavity 200, sand the second fan 204 is arranged inside the second cavity 200.

As shown in FIG. 2, the second air inlet 203 is arranged at a lower portion of the side surface of the second cavity 200, and the second fan 204 is arranged at an opening at an upper portion of the side surface of the second cavity 200. The side surface of the second cavity 200 may preferably be a relatively wide side surface, as shown in FIG. 2. In this way, not only the heat exchange between the ambient air and the air inside the second cavity 200 can be better performed through a relatively large area, but also the installation of the second air inlet 203 and the second fan 204 is more convenient.

In the embodiment shown in FIG. 2, no individual air outlet is provided; instead, the fan is directly arranged at the opening at the upper portion of the side surface. In practical implementation, the second fan 204 may also be arranged inside the second cavity 200, and an air outlet is further arranged at the upper portion of the side surface. The ventilation shown in FIG. 2 is performed in a manner that the air enters from the lower portion of the side surface and exits from the upper portion of the side surface (as shown by arrow lines inside and outside the second cavity 200 in FIG. 2). The ventilation manner may also be designed to allow the air to enter from a bottom portion of the second cavity 200 and exit from the upper portion of the side surface of the second cavity 200, that is, the second air inlet 203 is arranged at the bottom portion (a lower surface) of the second cavity 200. Or, the ventilation of the second cavity 200 may also be performed in a manner that the air enters from the upper portion of the side surface and exits from the lower portion of the side surface or the bottom portion, which is opposite to a ventilation direction shown in FIG. 2, in this case, the second air inlet 203 is arranged at the upper portion of the side surface of the second cavity 200, and the second fan 204 is arranged at an opening at the lower portion of the side surface (or the bottom portion) of the second cavity 200. The solutions by improving the protection class of the magnetic element 201 itself and using the ambient air as a heat dissipation medium fall within the scope of protection of the present application. Moreover, a louver may be arranged at the air inlet and the air outlet, so as to reduce the entry of dust.

A high-protection-level element and a third heat dissipation device are arranged in the third cavity 300, and the third heat dissipation device meets the heat dissipation requirements of the high-protection-level element.

The high-protection-level element refers to elements requiring a high protection level of all components of an inverter, except for the heat dissipation element 101 and the magnetic element 201, which mainly are power switch tubes (such as IGBT), capacitors and circuit boards, etc. Since these elements have a high protection level, the third heat dissipation device provided for them is preferably a heat exchanger connected to the third cavity 300, that is, a second heat exchanger 301 shown in FIGS. 1 and 2. Heat inside the cavity can be dissipated to the outside through heat exchange via the heat exchanger (as shown by arrow lines inside and outside the third cavity 300 in FIG. 1), which can prevent the air inside the cavity from being in contact with the ambient air, thereby preventing the outside polluted air from entering the inside of the cavity, and thus the cavity can be dust-tight.

In practical implementation, the second heat exchanger 301 may be arranged at a side surface of the third cavity 300. Taking a case that the third cavity 300 is a rectangular block as an example, the side surface of the third cavity 300 refers to any one of four side surfaces except an upper surface and a lower surface, preferably a relatively wide side surface, as shown in FIGS. 1 and 2. In this way, not only the heat exchange between the second heat exchanger 301 and the air inside the third cavity 300 can be performed through a relatively large area, but also the installation is more convenient.

In practical implementation, the second heat exchanger 301 may also be arranged at the other surfaces of the third cavity 300, as long as the heat dissipation requirements of the high-protection-level element can be satisfied, and the above solutions fall within the scope of protection of the present application.

Further, since the third cavity 300 has a large volume and the structure is relatively complicated, tan internal circulation fan and at least one partition plate may be further provided according to a specific structural layout of internal components, to form an internal circulation air duct.

According to the power cabinet of the embodiment, three types of devices, namely, a heat dissipation element 101, a magnetic element 201, and a high-protection-level element are arranged in three mutually independent cavities, respectively; corresponding heat dissipation devices are further arranged in the three cavities respectively, and each of the heat dissipation devices meets the heat dissipation requirements of the device in the corresponding cavity. With this arrangement, the three types of devices have their own heat dissipation solutions respectively and do not affect one another. Even if they are operated for a long time in a dusty environment, the magnetic element will not be affected by dust since the heat dissipation requirements of the three devices are satisfied in the three cavities respectively, and the reliability is improved compared with the conventional technology.

It should be noted that, in the conventional technology, the cavities are generally arranged in parallel, which takes up a large space. Therefore, another power cabinet is provided according to another embodiment of the present application based on the above embodiments. Preferably, as shown in FIGS. 1 and 2, a third cavity 300 is arranged at one side of the power cabinet; a first cavity 100 and a second cavity 200 are arranged at another side of the power cabinet; and the first cavity 100 and the second cavity 200 are arranged in an up-down direction, and both the first cavity 100 and the second cavity 200 are closely connected to the third cavity 300.

As shown in FIGS. 1 and 2, the first cavity and the second cavity 200 are arranged in the up-down direction, and the first cavity and the second cavity 200 are each closely connected to a back surface of the third cavity 300 though its own back surface. Specifically, each device in a circuit may be arranged at an inner side of the back surface of the corresponding cavity respectively, terminals required to be connected to devices in other cavities is allowed to protrude from the back surface of the cavity where the device is located, and end face sealing or plate sealing is performed, to ensure that the three cavities are independent of one another.

In practical implementation, the three cavities may each have its own surfaces, and be assembled together. Alternatively, all the devices inside the three cavities may be installed at two sides of a same back surface according to their own positions respectively, and the plate sealing is performed between the first cavity 100 and the second cavity 200, and then other surfaces of the cavities and the corresponding heat dissipating devices are assembled to the back surface, to form a casing of the entire power cabinet.

In the practical implementation, regardless of the way in which the entire power cabinet is assembled, the three cavities can be arranged to be a compact structure shown in FIGS. 1 and 2, thereby realizing utilization of space to a maximum extent.

Other structures and principles are the same as those in the above embodiments, and will not be further described herein.

In addition, it should be further noted that, for protection level setting of the power cabinet, based on the structural design shown in FIGS. 1 and 2, that is, heat exchange of the heat dissipation element, the magnetic element and the high-protection-level element is performed through three mutually independent cavities respectively, the protection level of each heat dissipation device can further be set, to make the entire power cabinet have a higher protection class such as IP65.

Specifically, in FIGS. 1 and 2, only the heat dissipation element 101 and the first fan 104 are arranged in the first cavity 100, the ventilation manner is that the air enters from the lower portion of the side surface and exits from the upper portion of the side surface, and the heat dissipation medium is the ambient air. Since the heat dissipation element 101 itself has a high protection level, in this case, the fan and the air inlet and outlet having a high protection level are employed, that is, the first air inlet 102, the first air outlet 103, and the first fan 104 are all designed to meet the requirements of the high protection class such as IP65, thereby improving the protection level of the entire first cavity 100.

Similarly, the second air inlet 203 and the second air fan 204 in FIG. 2 are both designed to meet the requirements of the protection class IP65, and the protection level of the second cavity 200 shown in FIG. 2 can also be improved.

In FIG. 1, heat exchangers are employed to perform heat exchange of the heat generating components inside the second cavity 200 and the third cavity 300, that is, the components inside the cavities are not in direct contact with the outside polluted air, and thus the magnetic element 201 and the high-protection-level element are dust-tight, and thereby meeting a higher protection class such as IP65.

The power cabinet provided according to the present embodiment can improve a protection level of the overall inverter power cabinet, so as to meet requirements of various outdoor working conditions.

Other structures and principles are the same as those of the above embodiment, which will not be described herein.

A grid-connected photovoltaic system is further provided according to another embodiment of the present application, wherein an inverter power cabinet is the power cabinet according to any of the above solutions, and the specific structure and arrangement manner of the inverter power cabinet may refer to the above embodiments, which will not be further described herein.

In practical implementation, the grid-connected photovoltaic system should also be provided with a photovoltaic array, an optimizer, a combiner box, a transformer, and a switch for grid connection, etc., which depends on the specific implementation environment and will not be limited herein, and the above solutions fall within the scope of protection of the present application.

A container is further provided according to another embodiment of the present application, including the power cabinet according to any one of the above embodiments. The specific structure and arrangement manner of the power cabinet may refer to the above embodiments, which will not be further described herein.

In practical implementation, the container is further provided with other electrical devices or communication devices, which depends on the specific implementation environment and will not be limited herein, and the above solutions fall within the scope of protection of the present application.

The above embodiments in this specification are described in a progressive manner. Each of the embodiments is mainly focused on describing its differences from other embodiments, and references may be made among these embodiments with respect to the same or similar portions among these embodiments.

The embodiments described hereinabove are only preferred embodiments of the present application, and are not intended to limit the scope of the present application in any form. Although the present application is disclosed by the above preferred embodiments, the preferred embodiments should not be interpreted as a limitation to the present application. For those skilled in the art, many variations, modifications or equivalent replacements may be made to the technical solutions of the present application by using the methods and technical contents disclosed hereinabove, without departing from the scope of the technical solutions of the present application. Therefore, any simple modifications, equivalent replacements and modifications, made to the above embodiments based on the technical essences of the present application without departing from the technical solutions of the present application, are deemed to fall into the scope of the technical solution of the present application.

The invention claimed is:

1. A power cabinet, comprising three mutually independent cavities, namely, a first cavity, a second cavity, and a third cavity; wherein
a heat dissipation element and a first heat dissipation device are arranged in the first cavity, and the first heat dissipation device is configured to meet heat dissipation requirements of the heat dissipation element;
a magnetic element and a second heat dissipation device are arranged in the second cavity, and the second heat dissipation device is configured to meet heat dissipation requirements of the magnetic element; and
a high-protection-level element and a third heat dissipation device are arranged in the third cavity, and the third heat dissipation device is configured to meet heat dissipation requirements of the high-protection-level element.

2. The power cabinet according to claim 1, wherein
the third cavity is arranged at one side of the power cabinet;
the first cavity and the second cavity are arranged at another side of the power cabinet; and
the first cavity and the second cavity are arranged in an up-down direction, and both the first cavity and the second cavity are closely connected to the third cavity.

3. The power cabinet according to claim 2, wherein
the first heat dissipation device comprises a first air inlet, a first air outlet, and a first fan;
both the first air inlet and the first air outlet are arranged at a surface of the first cavity; and
the first fan is arranged inside the first cavity.

4. The power cabinet according to claim 3, wherein
the first air inlet is arranged at a lower portion of a side surface of the first cavity;
the first air outlet is arranged at an upper portion of the side surface of the first cavity or at a top portion of the first cavity; and
the first fan is arranged below the heat dissipation element.

5. The power cabinet according to claim 3, wherein
the first air inlet is arranged at an upper portion of a side surface of the first cavity or at a top portion of the first cavity;
the first air outlet is arranged at a lower portion of the side surface of the first cavity; and
the first fan is arranged above the heat dissipation element.

6. The power cabinet according to claim 3, wherein all of the first air inlet, the first air outlet and the first fan meet requirements of protection class IP65.

7. The power cabinet according to claim 2, wherein
the second heat dissipation device comprises a second air inlet and a second fan;
the second air inlet is arranged at a surface of the second cavity; and
the second fan is arranged inside the second cavity.

8. The power cabinet according to claim 7, wherein
the second air inlet is arranged at a lower portion of a side surface of the second cavity or at a bottom portion of the second cavity; and
the second fan is arranged at an opening at an upper portion of the side surface of the second cavity.

9. The power cabinet according to claim 7, wherein
the second air inlet is arranged at an upper portion of a side surface of the second cavity; and
the second fan is arranged at a lower portion of the side surface of the second cavity or at an opening at a bottom portion of the second cavity.

10. The power cabinet according to claim 7, wherein both the second air inlet and the second fan meet requirements of protection class IP65.

11. The power cabinet according to claim 1, wherein the magnetic element is allowed to meet requirements of protection class IP65 through a potting process.

12. The power cabinet according to claim 1, wherein the second heat dissipation device comprises a first heat exchanger connected to the second cavity.

13. The power cabinet according to claim 1, wherein the third heat dissipation device comprises a second heat exchanger connected to the third cavity.

14. The power cabinet according to claim 13, wherein an internal circulation fan and at least one partition plate are further arranged in the third cavity, to allow a circulation air duct to be formed inside the third cavity.

15. The power cabinet according to claim 1, wherein the high-protection-level element comprises a power switch tube, a capacitor, and a circuit board.

16. The power cabinet according to claim 1, wherein the magnetic element comprises an electric reactor, a choking coil, and a transformer.

17. A grid-connected photovoltaic system, comprising an inverter power cabinet, wherein the inverter power cabinet is the power cabinet according to claim 1.

18. A container, comprising the power cabinet according to claim 1.

19. The power cabinet according to claim 2, wherein the second heat dissipation device comprises a first heat exchanger connected to the second cavity.

20. The power cabinet according to claim 2, wherein the third heat dissipation device comprises a second heat exchanger connected to the third cavity.

* * * * *